United States Patent [19]

Pascucci

[11] Patent Number: 5,751,654
[45] Date of Patent: May 12, 1998

[54] DRIVER DEVICE FOR SELECTION LINES FOR A MULTIPLEXER, TO BE USED IN A WIDE RANGE OF SUPPLY VOLTAGES, PARTICULARLY FOR NON-VOLATILE MEMORIES

[75] Inventor: Luigi Pascucci, Sesto San Giovanni, Italy

[73] Assignee: SGS-Thomson Microelectronics S.r.l., Agrate Brianza, Italy

[21] Appl. No.: 826,223

[22] Filed: Mar. 27, 1997

[30] Foreign Application Priority Data

Mar. 29, 1996 [EP] European Pat. Off. ............. 96830166

[51] Int. Cl.$^6$ ..................................... G11C 8/00
[52] U.S. Cl. ..................... 365/230.06; 365/185.23
[58] Field of Search ...................... 365/230.06, 230.02, 365/185.23, 189.01, 232.01, 189.02; 326/105, 106, 108

[56] References Cited

U.S. PATENT DOCUMENTS

| 5,311,481 | 5/1994 | Casper et al. | 365/230.06 |
| 5,402,386 | 3/1995 | Tavrow et al. | 365/230.06 |
| 5,534,797 | 7/1996 | McPartland | 365/230.06 |
| 5,668,485 | 9/1997 | Rountree | 363/230.06 |

FOREIGN PATENT DOCUMENTS

| A-0 362 715 | 4/1990 | European Pat. Off. | G11C 17/00 |
| A-0 525 678 | 2/1993 | European Pat. Off. | G11C 11/41 |

OTHER PUBLICATIONS

European Search Report from European Patent Application No. 96830166.3, filed Mar. 29, 1996.

IEEE Journal of Solid-State Circuits, Oct. 1979, USA, vol. SC-14, No. 5, pp. 860-864, Stewart R. G., "CMOS/SOS EAROM Memory Arrays".

Electronics, vol. 60, No. 14, Jul. 9, 1987, New York, USA, pp. 67-68, Cole, "Catalyst's EEPROM Needs A Miserly 3 Volts".

IEICE Transactions On Electronics, vol. E75 -C, No. 4, Apr. 1, 1992, pp. 481-485, Yoshikazu Miyawaki et al., "A New Erasing and Row Decoding Scheme For Low Supply Voltage Operation 16-MB/64-MB Flash Memories".

Primary Examiner—Tan T. Nguyen
Attorney, Agent, or Firm—Wolf, Greenfield & Sacks, P.C.

[57] ABSTRACT

A driver device for selection lines of a multiplexer, for use in a wide range of supply voltages, particularly for non-volatile memories. The driver device includes decoding circuitry for selecting the bit lines of a memory matrix; a first decoupling transistor of a first polarity, supplied by the supply voltage; a first inverter that is cascade-connected to the decoupling transistor; and a second transistor of a second polarity that is feedback-connected between the output and the input of the inverter. The driver device includes a switching circuit interposed between the decoding circuitry and the input of the inverter, the switching circuit being driven by control circuitry, in order to transfer to the input of the inverter a boost voltage that is higher than the supply voltage in order to provide faster reading of the memory matrix in the presence of low levels of the supply voltage.

25 Claims, 3 Drawing Sheets

DRIVER DEVICE FOR SELECTION LINES FOR A MULTIPLEXER, TO BE USED IN A WIDE RANGE OF SUPPLY VOLTAGES, PARTICULARLY FOR NON-VOLATILE MEMORIES

BACKGROUND OF THE INVENTION

1. Field of the Invention

The present invention relates to a driver device for selection lines for a multiplexer, particularly for non-volatile memories, to be used with a wide range of supply voltages.

2. Discussion of the Related Art

Non-volatile memories use a multiplexer to select the particular bit line of the memory matrix that must be carried either to an input to the sense amplifier to read the desired data item or in connection with structures that are adapted to program the elements.

Generally, in order to select a given line, a decoder (a multiplexer) is used that is formed by two buses, each with 16 lines to select a total of 256 lines (bit lines from 0 to 255). The bit lines are clustered into groups of 16 lines each and there are 16 such groups.

The second bus is associated with the bit lines of the memory matrix. In this manner, a single line that carries the data item of the selected bit line is presented to the sense amplifier or to programming structures.

A circuit that is currently used to drive the selection lines of such a multiplexer is shown in FIG. 1. The decoder buses are designated by YM/YN DEC. This circuit is compact and therefore widely used in the field of non-volatile memories. Generally, these memories have been proposed and developed for applications in which the value of the operating voltage varies in the range between 4.5 and 5.5 volts. Within this range of voltage values, the circuit shown in FIG. 1 is reliable and its performance is widely sufficient.

Considering the inverter means designated by 2 in FIG. 1, for example a CMOS inverter (not shown in FIG. 1), it can be seen that in view of the different voltage levels that are present at the input of the inverter with respect to the voltage levels that are present at the drain terminal of the P-type transistor that is part of the inverter 2, a situation may occur in which the inverter 2 cannot be considered free from currents, if the P-channel transistor does not switch off and if the supply voltage of the inverter 2 is brought to 12V.

Assuming a supply voltage $V_{DD}$ of 5 V is input to the inverter 2, and assuming that the voltage at the drain terminal of the P-type transistor rises above $V_{DD}$, then if the voltage difference between the gate terminal of the P-type transistor and its source terminal is greater than, or equal to, 1 V, the P-type transistor allows the passage of a current, towards the N-type transistor, that increases as the difference between the power supplies increases. In this manner, switching of the inverter is disturbed.

Therefore, the addition of a decoupling transistor 1 and of a feedback transistor 3 causes the value of the voltage input to the inverter to follow the voltage value that is present on the drain terminal of the P-type MOS included in the inverter 2.

A drawback of this solution can be observed in the fact that at least in the initial portion, at the input of the inverter 2 a voltage is present that is lower than the supply voltage present on the decoding buses YM/YN DEC, before this voltage is raised by the triggering of the feedback transistor 3.

The chart of FIG. 4 shows the level of the voltages at three nodes of the circuit of FIG. 1 and more specifically at the output of the decoding buses YM/YN DEC, node A, at the input of the inverter 2, node B, and at the output of the inverter, node C.

In the chart of FIG. 4, the supply voltage (and therefore the voltage in output from the decoding bus) is assumed to be 4.5 V. The voltage carried on the node B is initially lower than the supply voltage due to the drop caused by the threshold voltage of the N-type transistor and therefore a voltage reduction occurs as shown by the initial portion of the curve, designated by B.

Meanwhile, the node C is discharging, initially with a constant slope but, as a consequence of the switching on of the P-type feedback transistor 3, this slope increases and the node discharges to zero more rapidly. When the transistor 3 switches on, the P transistor that is part of the inverter 2 switches off.

The point where the discharge of the node C changes its slope therefore corresponds to the point where the curve designated by B starts to increase so as to asymptotically reach the same level as the supply voltage. This situation is therefore satisfactory for supply voltage values between 4.5 and 5.5 V, since the memory reading times are sufficiently short.

However, non-volatile memories operating at low voltages, i.e., with power supply values in the range between 2.7 and 3.3 volt, are currently increasingly demanded.

For such low voltage values, the circuit of FIG. 1 has drawbacks that are due to the low input voltage level.

Indeed, by considering the practical embodiment of the inverter means designated by 2 in FIG. 1, i.e., a CMOS inverter (not shown in FIG. 1), it can be seen that due to the different voltage levels that are present at the input of the inverter with respect to the voltage levels that are present at the drain terminal of the P-type transistor that is part of the inverter 2, a situation may occur in which the inverter 2 is no longer able to switch rapidly or, worse still, remains at the so-called metastability level, wherein an input voltage level at the inverter 2 is reached which is close to its trigger voltage.

For these supply voltage levels, as shown by the chart of FIG. 5, a behavior is noted that is similar to the one observed in the chart of FIG. 4, but with discharge times for the node C that are considerably longer and therefore with a consequent increase in memory reading times. This occurs even in the presence of appropriate boost circuits.

With these low supply voltage values, the feedback transistor 3 in fact takes longer to switch on with respect to the case in which higher supply voltages are used, and therefore the switching times increase as shown in the chart of FIG. 5. This is due to the fact that the input voltage to the inverter 2 is too low with respect to the supply that is present at that moment, and that the input voltage is also very close to the trigger value (equality between the input voltage and the output voltage) of the inverter 2, which is an equilibrium value.

Furthermore, the load output from the circuit of FIG. 1 is high, since the circuit must drive a large number of transistors (16 in this case) for access to the bit lines of the memory matrix, which have considerable dimensions.

Accordingly, one object of the present invention is therefore to provide a driver device for selection lines for a multiplexer, particularly for non-volatile memories, that has optimum operating characteristics over a wide range of supply voltage values.

Another object of the present invention is to provide a driver device for selection lines for a multiplexer, particularly for non-volatile memories, that allows optimum operation even with low supply voltage levels.

Another object of the present invention is to provide a driver device for selection lines for a multiplexer, particularly for non-volatile memories, that reduces the time required to reach operating levels in order to provide a faster memory reading time.

Another object of the present invention is to provide a driver device for selection lines for a multiplexer, particularly for non-volatile memories, that can be easily integrated thanks to its small bulk.

Another object of the present invention is to provide a device that is highly reliable and relatively easy to produce at competitive costs.

SUMMARY OF THE INVENTION

These objects, and others which will become apparent hereinafter are achieved by a driver device for selection lines for a multiplexer, for use in a wide range of supply voltages, particularly for non-volatile memories, that includes decoding means for selecting the bit lines of a memory matrix; a first decoupling transistor of a first polarity, supplied by the supply voltage; first inverter means that are cascade-connected to the decoupling transistor; and a second transistor of a second polarity that is feedback-connected between the output and the input of said inverter means the driver device also comprises switching means that are interposed between said decoding means and the input of said inverter means, the switching means being driven by a control means, in order to transfer to the input of said inverter means a boost voltage that is higher than the supply voltage in order to provide faster reading of the memory matrix in the presence of low supply voltage levels.

BRIEF DESCRIPTION OF THE DRAWINGS

Further characteristics and advantages of the invention will become apparent from the description of a device according to one embodiment of the invention, illustrated by way of non-limitative example in the accompanying drawings, wherein.

DETAILED DESCRIPTION

Figure 1:
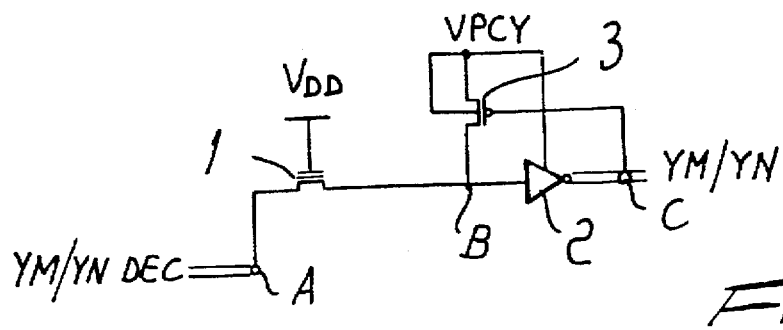
FIG. 1 is a view of a driver circuit for the selection lines for a multiplexer, according to the prior art.

With reference to the above figures, the device according to one embodiment of the invention includes a first circuit portion that is similar to the one shown in FIG. 1 and in which the same reference numerals have been assigned to identical elements.

In detail, the input of the circuit is constituted by decoding means provided by decoding buses YM/YN DEC, and the output is also a YM/YN bus that carries the data item selected of the decoding, to feed it to the sense amplifier of the memory.

Figure 2:
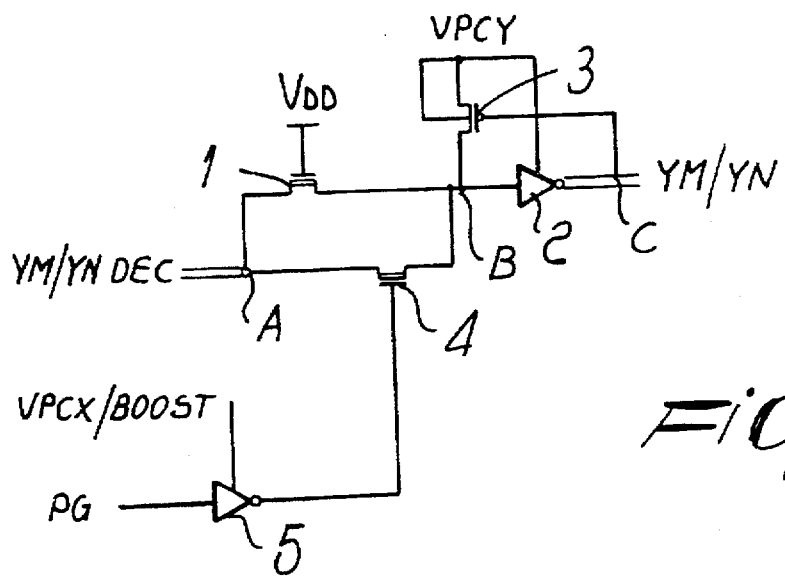
FIG. 2 is a view of a driver circuit for the selection lines for a multiplexer, according to one embodiment of the present invention.

The circuit shown in FIG. 2 is repeated a number of times equal to the number of lines of the selection bus. Therefore, in the case of a memory with two sub-buses YM and YN, each with 16 lines, there will be 32 circuits like the circuit of FIG. 2.

The decoding bus YM/YN DEC (to be exact, each line of the decoding bus) arrives as an input to a first decoupling transistor 1, the gate terminal of which is supplied by the supply voltage $V_{DD}$. Transistor 1 is of the N-channel type. The drain terminal of the transistor 1 is connected to an inverter 2, the output of which is fedback, by means of a second transistor 3, to the input of said inverter. The output of the inverter 2 is the bus YM/YN (i.e., one of the lines of the bus YM/YN).

In the second transistor 3, the drain terminal is connected to the voltage for controlling access to the bit lines (columns) of the matrix, designated by VPCY, the source terminal is connected to the input of the inverter 2, and the gate terminal is connected to the output of the inverter 2. The second transistor 3 is of the P-channel type.

The device also includes switching means, which is advantageously provided by a third transistor 4 in which the drain terminal is connected to the input of the inverter 2, the source terminal is connected to the bus YM/YN DEC, and the gate terminal is connected to the output of control means 5. The control means is conveniently provided by a second inverter 5. The third transistor 4 is of the N-channel type.

The second inverter 5 is driven by a programming signal PG indicating the presence (when PG=1) or the absence (when PG=0) of programming of the memory matrix.

The inverter 5 is supplied either by the voltage VPCX of the word lines of the memory matrix or by a boost voltage.

Figure 3:
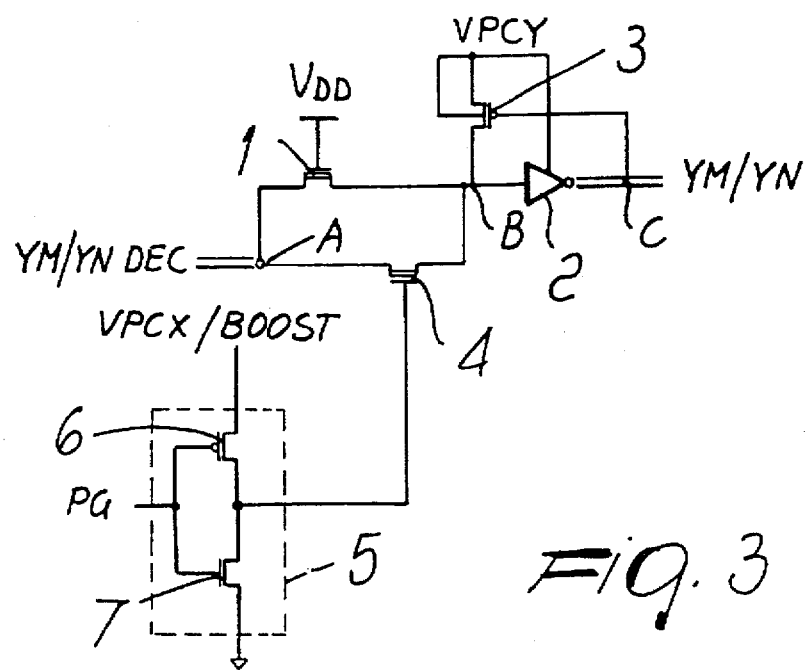
FIG. 3 is a more detailed view of the driver circuit according to one embodiment of the invention, illustrated in FIG. 3.

FIG. 3 illustrates the same circuit as FIG. 2, with the second inverter 5 shown as a CMOS type inverter. The inverter 5 comprises a first transistor 6 of the P-channel type and a second transistor 7 of the N-channel type, which are connected in a known inverting configuration.

Figure 4:
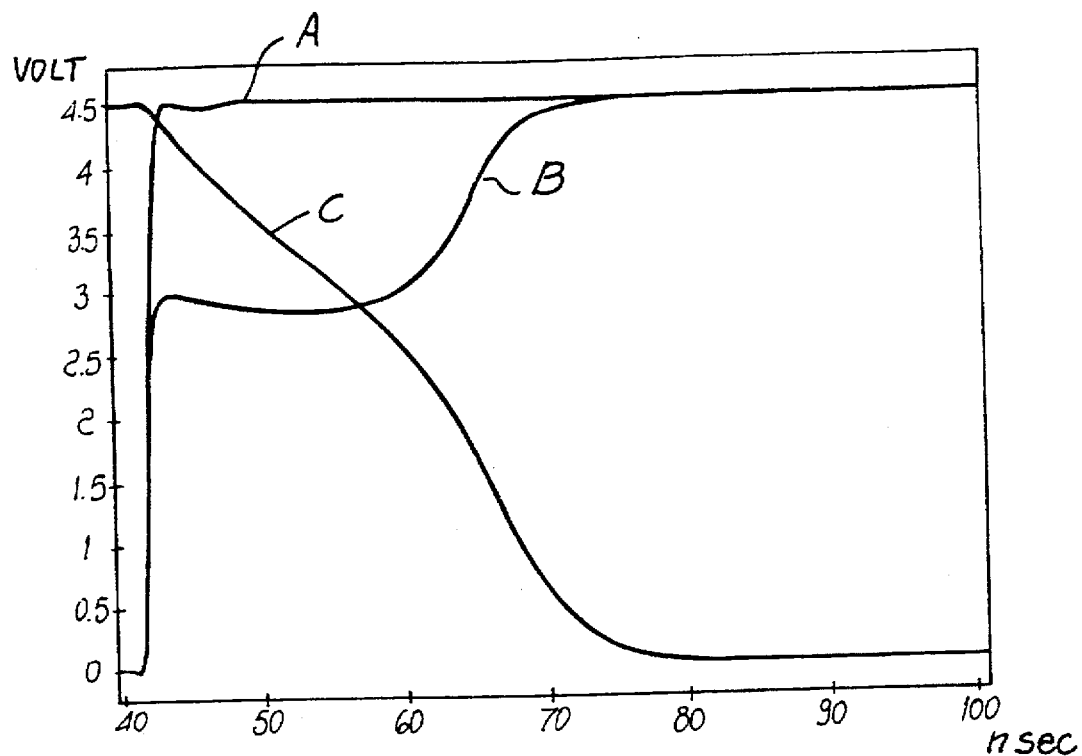
FIG. 4 is a chart plotting the voltage values at three nodes of the circuit of FIG. 1, with high supply voltage values.
Figure 5:
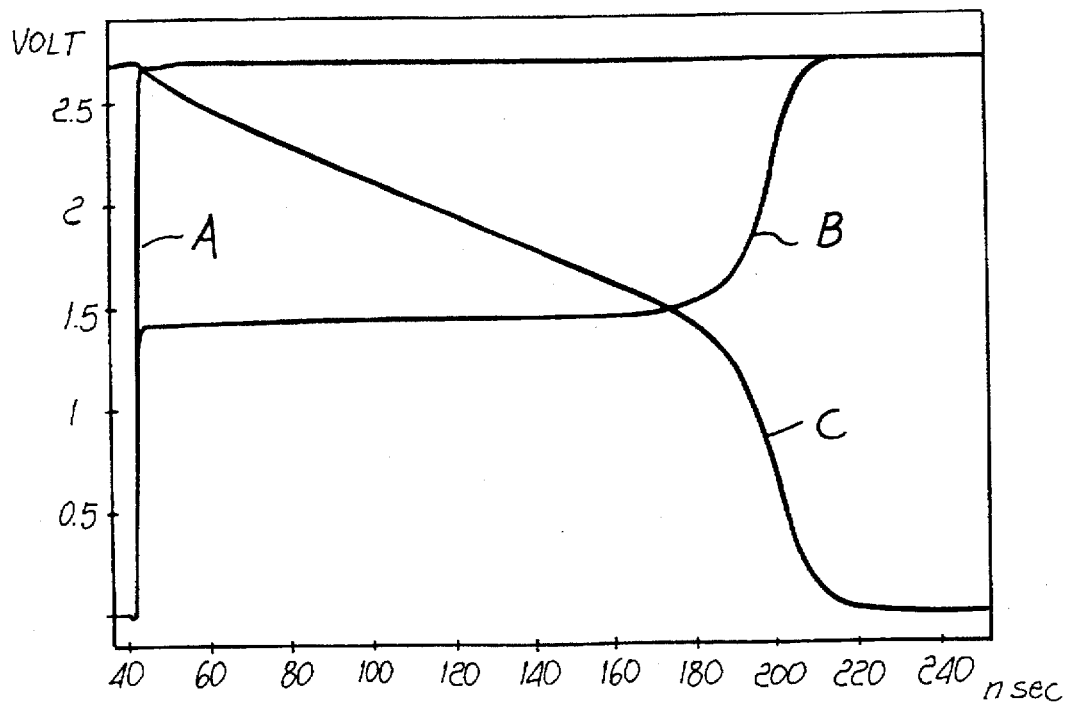
FIG. 5 is a chart plotting the voltage values of the circuit of FIG. 1, at the same three nodes of FIG. 4, with low supply voltage values.
Figure 6:
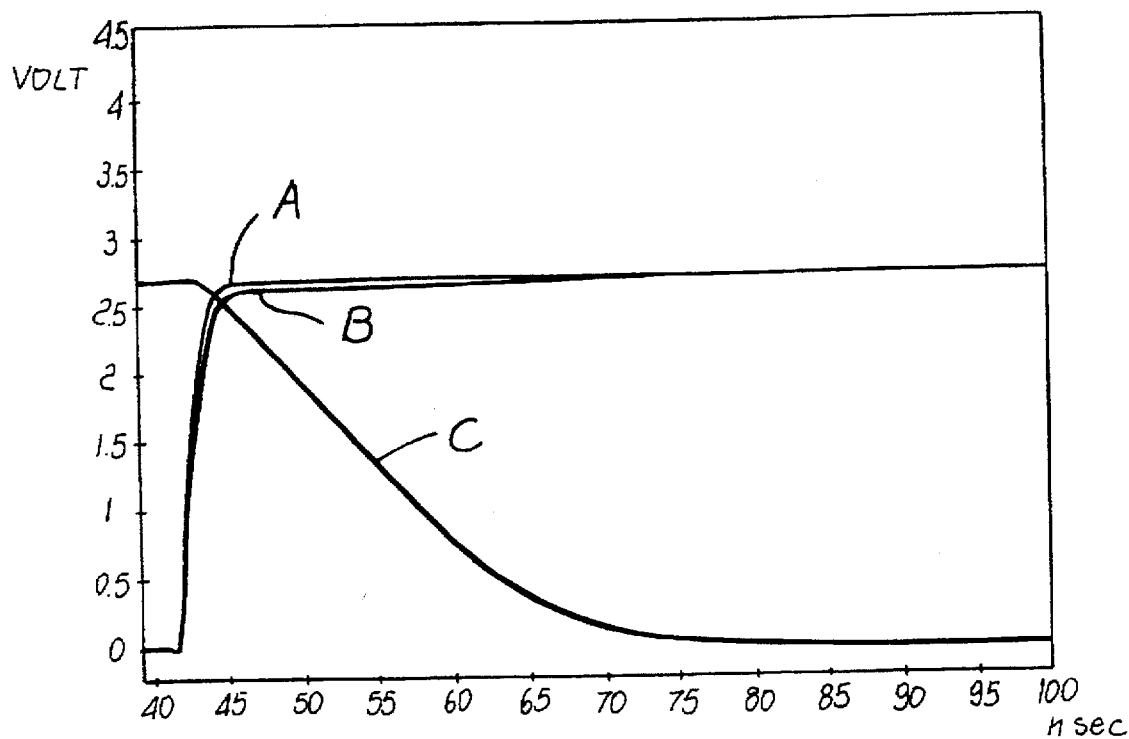
FIG. 6 is a chart plotting the voltage values of the circuit of FIG. 1 according to one embodiment of the invention, at the same three nodes shown in FIG. 4.

The chart of FIG. 6, similar to the charts of FIGS. 4 and 5, plots the voltages at three nodes of the circuit shown in FIGS. 2 and 3 and will be explained in detail with reference to the operation of the device according to one embodiment of the invention. With reference to FIGS. 2, 3, and 6, the operation of the device according to the invention is as follows.

During the reading of the memory matrix with a high supply voltage level (4.5–5.5 volts), the gate terminal of the transistor 4 receives a voltage that is equal to the supply voltage; in this manner, the voltage level transferred to the input node B of the inverter 2 is lower, by a threshold voltage, than the supply voltage, but is still sufficient to provide sufficiently fast switching. During reading with a low supply voltage level (2.7–3.3 volts) there are two possibilities: reading from the memory matrix in the normal way, by using the transistor 4 to carry to the input node of the inverter 2 a voltage level that is lower, by a threshold, than the supply voltage level, but with a consequent considerable slowing of the switching and reading time; or, if faster reading is required, a boost voltage that is already present in the device for other reasons can be used.

The inverter 5 that controls the voltage to be fed to the gate terminal of the transistor 4 is driven by the programming enabling signal PG, which is 1 during programming and 0 otherwise.

The input voltage to the inverter 5, defined as VPCX, varies between the supply voltage $V_{DD}$ and the boost voltage. When it is not in the programming mode and when the boost voltage generated by an appropriate pumping circuit is active (it should be noted that the boost voltage, when present, is always higher than the supply voltage $V_{DD}$), the boost voltage is carried to the gate terminal of the transistor 4. In this manner it is possible to make the node A follow more quickly the voltage level that is present at the drain terminal of the P transistor of the inverter 2 (node B).

Otherwise, if the signal PG becomes 1 (which indicates programming), the boost voltage is not necessary, since in the programming step it is not necessary to comply with particular speed specifications. In this case, the boost voltage would entail useless power consumption on the part of the device. In this situation, the output signal from the inverter 5 has a low level and therefore the transistor 4 is off.

The chart of FIG. 6 plots the voltages at the usual nodes A, B, and C of the circuit shown in FIGS. 1, 2, and 3. This chart shows that the node B closely follows the behavior of the node A, since the full level of the supply voltage can be transferred onto said node. Therefore, in the presence of the boost voltage it is possible to transfer to the input of the inverter 2 a voltage that is equal to the supply voltage, improving the performance of the device in terms of reading speed.

Comparison with the chart of FIG. 5, which applies to the same voltage supply values, clarifies the significant performance improvement of the circuit in terms of the time required to reach the operating level.

In particular, it is noted that the node B does not suffer a voltage drop with respect to the supply voltage (2.7 V), differently from what is shown in the chart of FIG. 5.

The circuit shown in FIGS. 2 and 3, according to one embodiment of the invention, is provided for each line of the decoding buses YM/YN DEC; therefore, with respect to the circuit of FIG. 1, there is only the addition of an N-channel transistor, since there is a single inverter 5 for the 32 lines of the decoding buses YM/YN DEC.

In practice, it has been observed that the device according to the invention allows transferring to the input to the inverter 2, whenever a boost voltage is active, a voltage level that is higher than the supply voltage, especially when the supply voltage has a low level.

In this manner, with a circuit modification entailing a very small area occupation, the circuit has been adapted to operate in a wide range of supply voltage values, overcoming the drawbacks of conventional solutions. The device thus conceived is susceptible of numerous modifications and variations, all of which are within the scope of the inventive concept.

For example, the transistor 4 shown in FIGS. 2 and 3 as being of the N-channel type can also be of the P-channel type. In this case, the programming signal input to the inverter 5 is inverted. Finally, all the details may be replaced with other technically equivalent elements.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A driver device for selection lines for a multiplexer for a memory, for use with a range of supply voltages, comprising:
   decoding means for selecting bit lines of a memory matrix;
   a first decoupling transistor of a first polarity, supplied by a supply voltage;
   first inverter means cascade-connected to said first decoupling transistor;
   a second transistor of a second polarity that is feedback-connected between an output and an input of said first inverter means; and
   switching means that are interposed between said decoding means and the input of said inverter means, said switching means being driven by a control means, in order to transfer to the input of said inverter means a boost voltage that is higher than said supply voltage in order to provide faster reading of the memory matrix when the supply voltage is at a low level.

2. The device according to claim 1, wherein said control means receive as an input a programming enabling signal, said control means being supplied by a voltage level that can be switched between said supply voltage and said boost voltage, wherein switching of the voltage level being triggered by said programming enabling signal.

3. The device according to claim 2, wherein said control means includes a complementary MOS inverter.

4. The device according to claim 1, wherein said switching means includes a transistor, said transistor being off when said programming enabling signal indicates said memory matrix is being programmed.

5. The device according to claim 4, wherein said transistor is an N-channel type transistor.

6. The device according to claim 4, wherein said transistor is a transistor of the P-channel type.

7. The device according to claim 4, wherein said switching means includes a transistor, said transistor being off when said programming enabling signal indicates said memory matrix is being programmed.

8. The device according to claim 7, wherein said control means includes a complementary MOS inverter.

9. The device according to claim 1, wherein said control means includes a complementary MOS inverter.

10. The device according to claim 1, wherein said first decoupling transistor of a first polarity is a transistor of the N-channel type.

11. The device according to claim 1, wherein said second transistor of a second type of polarity is a transistor of the P-channel type.

12. A driver device for driving selection lines for a memory matrix, comprising:
    a first inverter having an input and an output;
    a first transistor coupled to the input of the first inverter for driving the first inverter, the first transistor being driven by a supply voltage;
    a second transistor coupled between the input and output of the first inverter; and
    a third transistor coupled to the input of the first inverter for driving the first inverter, wherein the third transistor is driven by a voltage greater than said supply voltage.

13. The device of claim 12, further comprising a second inverter coupled to the third transistor for driving the third transistor.

14. The device of claim 13, wherein the third transistor includes a gate coupled to the second inverter, a drain coupled to the input of the first inverter and a source coupled to a decoder bus.

15. The device of claim 14, wherein the first transistor includes a gate coupled to the supply voltage, a drain coupled to the input of the first inverter, and a source coupled to the decoder bus.

16. The device of claim 15, wherein the second inverter receives a control signal, wherein when the control signal is in a first state the second inverter couples the supply voltage to the third transistor, and when the control signal is in a second state the second inverter couples the voltage greater than said supply voltage to the third transistor.

17. The device of claim 13, wherein the second inverter receives a control signal, wherein when the control signal is in a first state the second inverter couples the supply voltage to the third transistor, and when the control signal is in a second state the second inverter couples the voltage greater than said supply voltage to the third transistor.

18. The device of claim 7, wherein the control signal is a programming signal that indicates the memory matrix is being programmed.

19. The device of claim 12, wherein the third transistor includes a gate coupled to the voltage greater than the supply voltage, a drain coupled to the input of the first inverter and a source coupled to a decoder bus.

20. The device of claim 12, wherein the first transistor includes a gate coupled to the supply voltage, a drain coupled to the input of the first inverter, and the source coupled to the decoder bus.

21. A driver device for driving selection lines for a memory matrix, comprising:

a first inverter having an input and an output;

a first transistor coupled to the input of the first inverter for driving the first inverter, the first transistor being driven by a supply voltage;

a second transistor coupled between the input and output of the first inverter; and means, coupled to the input of the first inverter, for driving the first inverter, at a voltage greater than said supply voltage.

22. The device of claim 21, wherein the first transistor includes a gate coupled to the supply voltage, a drain coupled to the input of the first inverter, and a source coupled to a decoder bus.

23. The device of claim 22, wherein the means for driving the first inverter receives a control signal, wherein when the control signal is in a first state the means for driving the first inverter couples the supply voltage to the first inverter, and when the control signal is in a second state the means for driving the first inverter couples the voltage greater than said supply voltage to the first inverter.

24. The device of claim 23, wherein the control signal is a programming signal that indicates the memory matrix is being programmed.

25. A method for driving selection lines for a memory matrix, comprising the steps of:

(A) decoding which of one or more of the selection lines is to be driven;

(B) coupling an inverter coupled to the selection lines to a first voltage if a supply voltage is above a particular value;

(C) coupling the inverter coupled to the selection lines to a second voltage greater than the first voltage if the supply voltage is below the particular value.

* * * * *